(12) United States Patent
Guillou et al.

(10) Patent No.: US 10,937,987 B1
(45) Date of Patent: Mar. 2, 2021

(54) ELECTRONIC DEVICES HAVING DISPLAYS WITH TILTED ANODES

(71) Applicant: Apple Inc., Cupertino, CA (US)

(72) Inventors: Jean-Pierre S. Guillou, Los Gatos, CA (US); Meng-Huan Ho, San Jose, CA (US); Ming Xu, Cupertino, CA (US); Rui Liu, San Jose, CA (US); Shawn R. Gettemy, San Martin, CA (US); Yi Qiao, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/428,698

(22) Filed: May 31, 2019

Related U.S. Application Data

(60) Provisional application No. 62/701,209, filed on Jul. 20, 2018.

(51) Int. Cl.
*H01L 51/52* (2006.01)
*H01L 51/00* (2006.01)
*H01L 27/32* (2006.01)

(52) U.S. Cl.
CPC ...... *H01L 51/5209* (2013.01); *H01L 27/3258* (2013.01); *H01L 51/0097* (2013.01); *H01L 51/5265* (2013.01); *H01L 51/5234* (2013.01); *H01L 2251/5315* (2013.01); *H01L 2251/5338* (2013.01)

(58) Field of Classification Search
CPC ............. H01L 51/5209; H01L 27/3258; H01L 51/0097; H01L 51/5234; H01L 2251/5315; H01L 2251/5338
See application file for complete search history.

(56) References Cited

U.S. PATENT DOCUMENTS

| 28,341 | A | 5/1860 | Bennett |
| 4,349,817 | A | 9/1982 | Hoffman et al. |
| 4,534,813 | A | 8/1985 | Williamson et al. |
| 5,329,386 | A | 7/1994 | Birecki et al. |
| 5,502,457 | A | 3/1996 | Sakai et al. |
| 5,659,378 | A | 8/1997 | Gessel |
| 6,046,730 | A | 4/2000 | Bowen et al. |
| 6,407,785 | B1 | 6/2002 | Yamazaki |

(Continued)

FOREIGN PATENT DOCUMENTS

KR 20180034832 A 4/2018

*Primary Examiner* — Fernando L Toledo
*Assistant Examiner* — Valerie N Newton
(74) *Attorney, Agent, or Firm* — Treyz Law Group, P.C.; G. Victor Treyz; Matthew R. Williams

(57) ABSTRACT

An electronic device may have a flexible organic light-emitting diode display layer. The edge of the flexible display layer may be bent. The display may have pixels formed from organic light-emitting diodes having anodes characterized by anode surface normals. For pixels in some regions of the display such as the bent edge of the display, the display may be characterized by a display surface normal for a pixel that differs from an anode surface normal for the anode of the organic light-emitting diode of that pixel. By tilting the anodes in this way, color shifts due to off-axis viewing of the pixels in the bend edge of the display can be minimized. If desired, tilted anodes may have multiple areas with different tilts. Sets of pixels with different anode tilts or other characteristics that differ may be supplied with common pixel data values.

19 Claims, 12 Drawing Sheets

(56) References Cited

U.S. PATENT DOCUMENTS

| | | |
|---|---|---|
| 6,467,922 B1 | 10/2002 | Blanc et al. |
| 6,680,761 B1 | 1/2004 | Greene et al. |
| 6,845,190 B1 | 1/2005 | Smithwick et al. |
| 7,228,051 B2 | 6/2007 | Cok et al. |
| 7,542,209 B2 | 6/2009 | McGuire, Jr. |
| 7,823,309 B2 | 11/2010 | Albenda |
| 7,856,161 B2 | 12/2010 | Tabor |
| 8,045,270 B2 | 10/2011 | Shin et al. |
| 8,723,824 B2 | 5/2014 | Myers et al. |
| 8,824,779 B1 | 9/2014 | Smyth |
| 8,976,324 B2 | 3/2015 | Yang et al. |
| 9,268,068 B2 | 2/2016 | Lee |
| 9,312,517 B2 | 4/2016 | Drzaic et al. |
| 9,342,105 B2 | 5/2016 | Choi et al. |
| 9,509,939 B2 | 11/2016 | Henion et al. |
| 9,591,765 B2 | 3/2017 | Kim et al. |
| 9,755,004 B2 | 9/2017 | Shieh et al. |
| 9,818,725 B2 | 11/2017 | Bower et al. |
| 9,907,193 B2 | 2/2018 | Lee et al. |
| 10,048,532 B2 | 8/2018 | Powell et al. |
| 10,052,831 B2 | 8/2018 | Welker et al. |
| 2006/0016448 A1 | 1/2006 | Ho |
| 2007/0097108 A1 | 5/2007 | Brewer |
| 2008/0144174 A1 | 6/2008 | Lucente et al. |
| 2008/0186252 A1 | 8/2008 | Li |
| 2010/0177261 A1 | 7/2010 | Jin et al. |
| 2010/0238090 A1 | 9/2010 | Pomerantz et al. |
| 2011/0025594 A1 | 2/2011 | Watanabe |
| 2011/0057861 A1 | 3/2011 | Cok et al. |
| 2011/0102300 A1 | 5/2011 | Wood et al. |
| 2011/0242686 A1 | 10/2011 | Wantanbe |
| 2012/0218219 A1 | 8/2012 | Rappoport et al. |
| 2013/0081756 A1 | 4/2013 | Franklin et al. |
| 2013/0083080 A1 | 4/2013 | Rappoport et al. |
| 2013/0235560 A1 | 9/2013 | Etienne et al. |
| 2013/0279088 A1 | 10/2013 | Raff et al. |
| 2014/0037257 A1 | 2/2014 | Yang et al. |
| 2014/0092028 A1 | 4/2014 | Prest et al. |
| 2014/0092346 A1 | 4/2014 | Yang et al. |
| 2014/0183473 A1 | 7/2014 | Lee et al. |
| 2014/0240985 A1 | 8/2014 | Kim et al. |
| 2014/0328041 A1 | 11/2014 | Rothkopf et al. |
| 2014/0354920 A1 | 12/2014 | Jang et al. |
| 2015/0001477 A1* | 1/2015 | Namkung ........... H01L 27/3258 257/40 |
| 2015/0093087 A1 | 4/2015 | Wu |
| 2015/0227227 A1 | 8/2015 | Myers et al. |
| 2016/0231784 A1 | 8/2016 | Yu et al. |
| 2016/0234362 A1 | 8/2016 | Moon et al. |
| 2017/0062528 A1* | 3/2017 | Aoyama ........... G02F 1/133514 |
| 2017/0235341 A1 | 8/2017 | Huitema et al. |
| 2018/0052312 A1 | 2/2018 | Jia et al. |
| 2018/0088416 A1 | 3/2018 | Jiang et al. |
| 2018/0372958 A1 | 12/2018 | Karafin et al. |

* cited by examiner

ELECTRONIC DEVICES HAVING DISPLAYS WITH TILTED ANODES

This application claims the benefit of provisional patent application No. 62/701,209, filed Jul. 20, 2018, which is hereby incorporated by reference herein in its entirety.

FIELD

This relates generally to electronic devices, and, more particularly, to electronic devices with displays.

BACKGROUND

Electronic devices such as cellular telephones, tablet computers, and other electronic equipment may include displays for presenting images to a user.

If care is not taken, electronic devices with displays may not have a desired appearance or may be difficult to use satisfactorily. For example, displays may be bulky and unattractive or may not accommodate a desired electronic device shape.

SUMMARY

An electronic device may have a flexible organic light-emitting diode display layer. The edge of the flexible display layer may be bent.

The display may be configured to reduce color shifts due to off-axis viewing of pixels in the bent edge of the flexible display layer. Pixels in the display may be formed from organic light-emitting diodes having anodes characterized by anode surface normals. For pixels in at least some regions of the display such as the bent edge of the display, the display may be characterized by a display surface normal for each pixel that differs from an anode surface normal of that pixel.

By tilting the anodes in the pixels in this way, color shifts due to off-axis viewing of the pixels in the bent edge of the display can be minimized. If desired, each anode may have multiple areas with different tilts. Configurations in which anode tilt or other pixel characteristics such as organic light-emitting diode emissive material composition, anode shape, and diode cavity strength, are increased as a function of increasing distance into the bent edge portion away from the center of the display may also be used.

In some arrangements, sets of pixels with different anode tilts or other characteristics that differ may be supplied with common pixel data values. For example, a pair of first and second pixels with opposing anode tilts may each be supplied with the same pixel data value. The pair of pixels may exhibit reduced sensitivity to viewing angle changes. Equal pixel data may be supplied to each of the pixels in a pair of pixels or other set of pixels using signal paths that short organic light-emitting diodes in the pixels of the set of pixels together or a common pixel value may be supplied to each of the pixels in the set of pixels during data loading.

DETAILED DESCRIPTION

Electronic devices may be provided with displays. The displays may have planar surfaces and curved surfaces. For example, a display may have a planar central portion surrounded by bent edges. The bent edges may have curved surface profiles. Arrangements in which displays exhibit compound curvature may also be used. Electronic devices having displays with curved surfaces may have an attractive appearance, may allow the displays to be viewed from a variety of different angles, and may include displays with a borderless or nearly borderless configuration.

Figure 1:
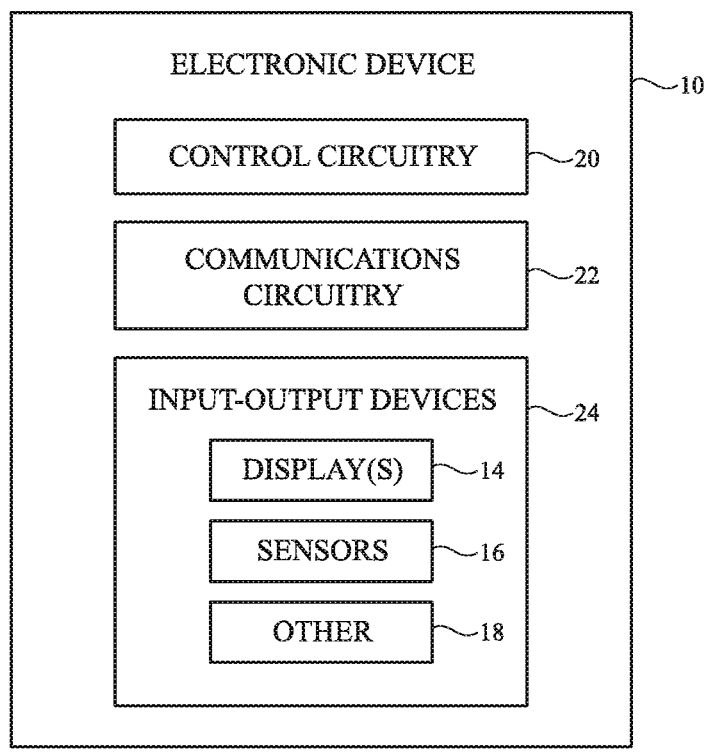
FIG. 1 is a schematic diagram of an illustrative electronic device in accordance with an embodiment.

A schematic diagram of an illustrative electronic device having a display with curved surface portions is shown in FIG. 1. Device 10 may be a cellular telephone, a tablet computer, a laptop computer, a wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external equipment, control circuitry 20 may communicate using communications circuitry 22. Circuitry 22 may include antennas, radio-frequency transceiver circuitry, and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a 60 GHz link or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. During operation, control circuitry 20 may use sensors and other input devices in devices 24 to gather input and can control output devices in devices 24 to provide desired output.

Devices 24 may include one or more displays such as display(s) 14. An output device such as display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. In illustrative configurations described herein, display 14 is an organic light-emitting diode display.

Display 14 may have a layer of pixels (e.g., a pixel array) configured to display images for a user. The pixels may be formed on a substrate such as a flexible substrate (e.g., display 14 may be formed from a flexible display panel). Conductive electrodes for a capacitive touch sensor in display 14 and/or an array of indium tin oxide electrodes or other transparent conductive electrodes overlapping display 14 may be used to form a two-dimensional capacitive touch sensor for display 14 (e.g., display 14 may be a touch sensitive display).

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

If desired, electronic device 10 may include additional components (see, e.g., other devices 18 in input-output devices 24). The additional components may include haptic output devices, audio output devices such as speakers, light producing output devices such as light-emitting diodes for status indicators, light sources such as light-emitting diodes (e.g., crystalline semiconductor light-emitting diodes) that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
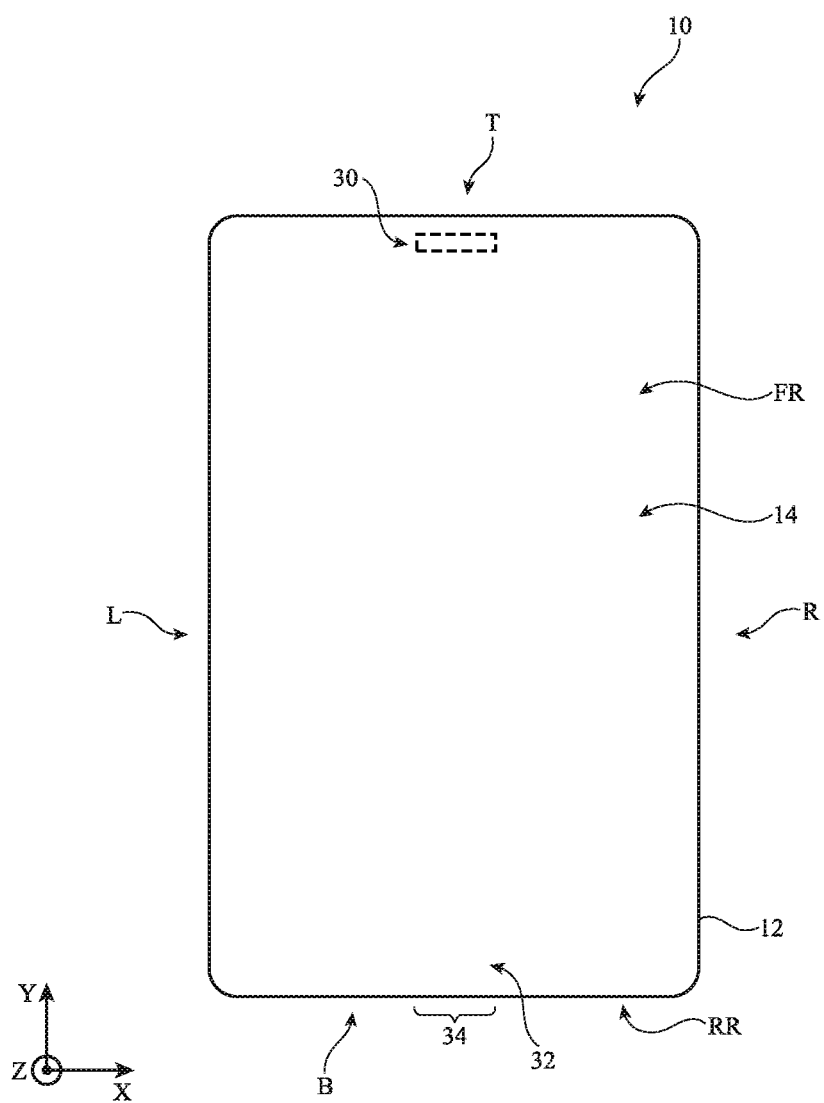
FIG. 2 is a top view of an illustrative electronic device in accordance with an embodiment.

FIG. 2 is a front (plan) view of electronic device 10 in an illustrative configuration in which display 14 covers some or all of the front face FR of device 10. Opposing rear face RR of device 10 may be covered by a housing wall formed from glass, metal, polymer, and/or other materials. Rear face RR may be free of display pixels and/or may be partly or fully covered by display 14.

Device 10 may include a housing (e.g., housing 12) that forms sidewall structures for device 10 and/or internal supporting structures (e.g., a frame, midplate member, etc.). In some illustrative arrangements, sidewall portions of device 10 may be covered with portions of display 14. In the example of FIG. 2, device 10 is characterized by four peripheral edges: upper edge T, lower edge B, left edge L, and right edge R. Upper edge T and opposing lower edge B may run parallel to each other and parallel to the X axis of FIG. 2. Left edge L and opposing right edge R may run parallel to each other and parallel to the Y axis of FIG. 2. Front face FR and rear face RR may be planar (e.g., two parallel planes offset by a distance along the Z axis) and/or may include curved portions.

Touch sensor circuitry such as two-dimensional capacitive touch sensor circuitry may be incorporated into one or more display panels in device 10 as separate touch sensor panels overlapping display pixels or may be formed as part of one or more display panels in device 10. Touch sensors may be formed on front face FR, rear face RR, and/or edges (sidewall faces) T, B, R, and/or L. If desired, icons and other images for virtual buttons may be displayed by the pixels of device. For example, virtual buttons and/or other images may be displayed on front face FR, rear face RR, and/or sidewall structures in device 10 such as edges T, B, R, and/or L and may overlap touch sensor circuitry. Haptic output devices may be used to provide haptic feedback when virtual buttons are selected (as an example).

Device 10 of FIG. 2 has a rectangular outline with four rounded corners. If desired, device 10 may have other shapes. For example, device 10 may have a shape that folds and unfolds along a bend (folding) axis and may include a display that overlaps or that does not overlap the bend axis, may have a shape with an oval footprint or circular outline, may have a cubic shape, may have a pyramidal, cylindrical, or conical shape, or may have other suitable shapes. The configuration of FIG. 2 is illustrative.

If desired, openings may be formed in the surfaces of device 10. For example, a speaker port and optical windows for an ambient light sensor, an infrared proximity sensor, and a depth sensor may be formed in a region such as upper region 30 of front face FR. A finger print sensor, touch sensor button, force-sensitive button, or other sensor that operates through display 14 may be formed under the portion of display in lower region 32 on front face FR and/or other portions of front face FR and/or other external surfaces of device 10. An optional opening for a connector (e.g., a digital data connector, analog signal connector, and/or power connector) may be formed in portion 34 of the lower sidewall of device 10 running along lower edge B. This opening may be omitted when power is received wirelessly or is received through contacts that are flush with the surface of device 10 and/or when data is transferred and received wirelessly using wireless communications circuitry in circuitry 22 or through contacts that are flush with the exterior surface of device 10.

Figure 3:
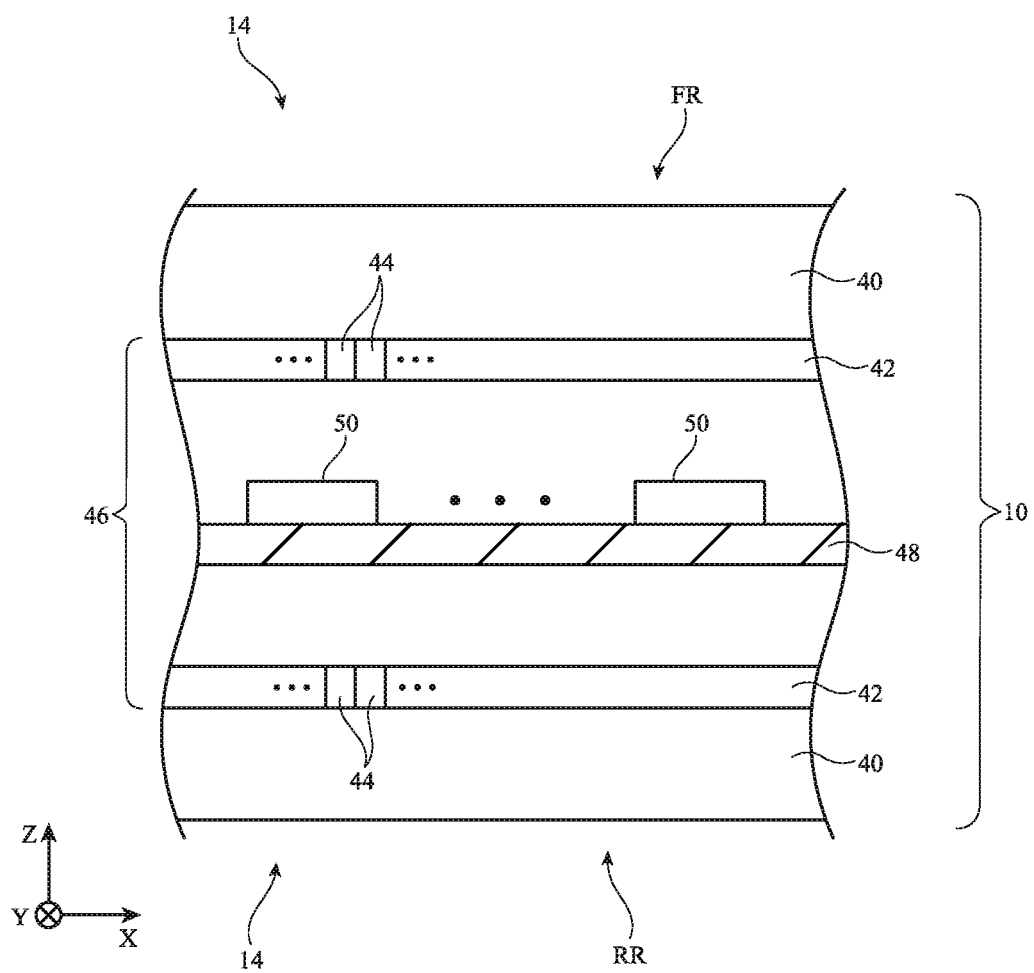
FIG. 3 is a cross-sectional side view of an illustrative electronic device in accordance with an embodiment.

FIG. 3 is a cross-sectional side view of an illustrative electronic device. As shown in FIG. 3, display 14 may be formed on front face FR and/or rear face RR of device 10. Display 14 may include one or more transparent protective layers such as display cover layer 40. Display cover layer 40 may be formed from transparent material such as clear glass, polymer, sapphire or other crystalline material, or other transparent material. Display layers such as layers 42 may have arrays of pixels 44 that form images. The pixel arrays (e.g., layers 42) may sometimes be referred to as pixel layers, pixel array layers, displays, display structures, display layers, or display panels. For example, layers 42 may be formed from organic light-emitting diode displays. In the example of FIG. 3, device 10 has a first display 14 (or first display portion of a display panel or other display structure) formed from a first pixel array 42 on front face FR. This first pixel array is visible in the −Z direction through display cover layer 40 on front face FR. Device 10 of FIG. 3 also has a second display 14 (or second display portion of the display panel or other display structure) formed from a second pixel array 42 on rear face RF. This second pixel array is visible in the +Z direction through display cover layer 40 on rear face RR. The front and/or rear surfaces formed by display cover layer(s) 40 may be planar (as shown in FIG. 3) or may have a curved profile.

If desired, the second display 14 of device 10 may be omitted. For example, pixel array 42 on rear face RR may be omitted. In this configuration, the inner surface of layer 40 on rear face RR may be coated with a black masking material or other opaque coating and/or may be coated with colored and/or shiny structures. Coating material can be patterned to form logos, text, and other visual elements. This type of arrangement may be used to hide internal components in interior 46 of device from view from the exterior of device 10. As shown in FIG. 3, for example, device 10 may include electrical components 50 in interior 46 (e.g., integrated circuits, sensors and other input-output devices, control circuitry, display layers 42 such as organic light-emitting diode panels or other display layers, etc.). Electrical components 50 may, if desired, be mounted on printed circuits such as printed circuit 48 (e.g., flexible printed circuits and/or printed circuits formed from rigid printed circuit board material). In configurations such as these in which the lower pixel array of device 10 is omitted, the portion of device 10 on rear face RR (e.g., layer 40) may be formed from metal (e.g., a stainless steel or aluminum layer). For example, device 10 may have a rear housing wall formed from metal. Device 10 may also have housing walls formed from opaque glass, transparent glass coated with opaque materials such as ink or metal, and/or other housing wall materials.

In some configurations for device 10, an opaque material such as metal or opaque polymer may form some or all of the sidewalls of device 10. As an example, metal that forms some or all of a rear housing wall on rear face RR of device 10 may protrude upwardly along the edges of device 10 to form some or all of the sidewalls for device 10. As another example, a peripheral metal band that forms some or all of the sidewalls of device 10 may extend around the rectangular periphery of device 10 (e.g., along upper edge T, right edge R, lower edge B, and left edge L). Sidewalls may have vertically extending planar surfaces and/or may exhibit other surface profiles (e.g., curved profiles).

If desired, some or all of the sidewalls of device 10 may be formed from clear material and may overlap light-producing components. This material may, as an example, be part of display cover layers 40 of FIG. 3 (e.g., an extending piece of glass, polymer, crystalline material, or other transparent display cover layer material). Because clear layers of glass, plastic, crystalline material, and/or other clear layers of material in device 10 may enclose and protect internal device components, these outer layers of material in device 10 serve as an enclosure (housing 12) for device 10.

In configurations for device 10 in which sidewalls have transparent portions formed from extending portions of display cover layers 40 or other transparent material, the sidewalls may overlap light-emitting components. Transparent sidewalls may have planar and/or curved surfaces and may be formed from clear glass, clear polymer, transparent crystalline material such as sapphire, and/or other transparent protective material. Displays (pixel arrays), light-emitting diodes covered with diffusing material, light-emitting diodes covered with patterned masks (e.g., opaque coatings with icon-shaped openings or openings of other shapes), and/or other light-emitting devices may be placed under clear sidewalls.

During operation, light emitted from the pixels or other light-emitting components under the sidewalls may pass through the sidewalls. In arrangements in which display panels are placed under transparent sidewalls, images may be displayed through the sidewalls. The images may form parts of images being displayed on front face FR and/or rear face RR and/or may be separate images. For example, a photograph may extend across front face FR and some or all of the sidewalls of device 10 and/or a photograph may cover only front face FR while virtual buttons are displayed on the sidewalls of device 10. In arrangements in which one or more light-emitting diodes and an overlapping diffuser are placed under transparent sidewalls, diffuse light may be emitted through the sidewalls.

In addition to optional opaque housing structures such as metal housing walls or opaque walls formed from other materials, device 10 may include display cover layers 40 and other structures formed from transparent glass, transparent polymer, and/or other transparent material. These materials may surround the interior of device 10 and thereby serve as a housing for device 10 as well as serving as protective layers for pixel arrays and other light-emitting components. In the example of FIG. 3, the front surface of device 10 is formed by a planar surface of display cover layer 40 on front face FR and the rear surface of device 10 is formed by a planar surface of display cover layer 40 on rear face RR. In general, device 10 may have planar surface portions and/or curved surface portions (surface portions with curved profiles) and these portions may be formed by display cover layers, other layers formed from glass, polymer, sapphire or other crystalline material, ceramic, or other potentially transparent materials, metal, wood, or other materials.

Figure 4:
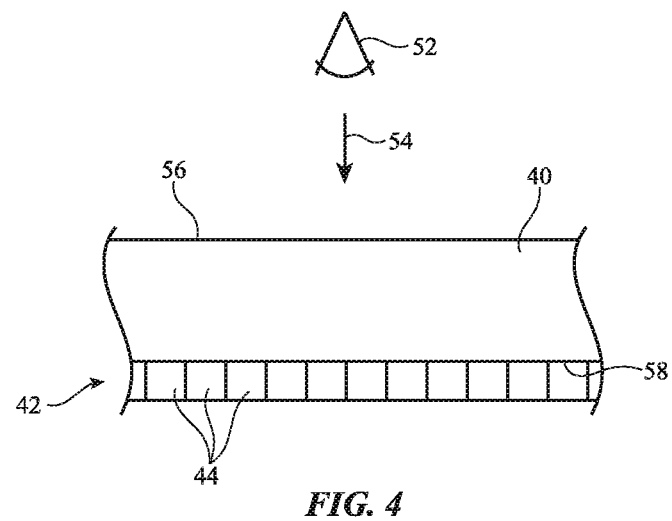
FIG. 4 is a cross-sectional side view of an illustrative planar portion of a display cover layer and pixel array in accordance with an embodiment.
Figure 5:
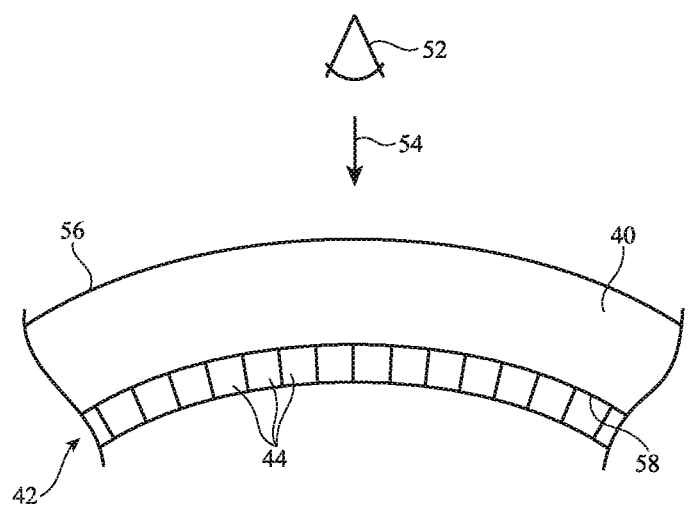
FIG. 5 is a cross-sectional side view of an illustrative curved portion of a display cover layer and pixel array in accordance with an embodiment.

Transparent portions of device 10 may overlap pixels or other light-emitting components that emit light that is visible to a user. In the illustrative arrangements of FIGS. 4 and 5, an array of pixels 44 in layer 42 is configured to emit light that passes through display cover layer 40 for viewing by viewer 52 (e.g., in direction 54 and/or other directions from the exterior of device 10). The inner and outer surface of layers 40 (and other layers enclosing the interior of device 10) may be planar and/or curved. In the illustrative configuration of FIG. 4, outer surface 56 of layer 40 and inner surface 58 of layer 40 are planar. Inner surface 58 of FIG. 4 may be curved or partly planar and partly curved, if desired. In the illustrative configuration of FIG. 5, outer surface 56 of layer 40 is curved and inner surface 58 of layer 40 is curved. Inner surface 58 may, if desired, be planar or may have planar and curved surface profile portions.

Figure 6:
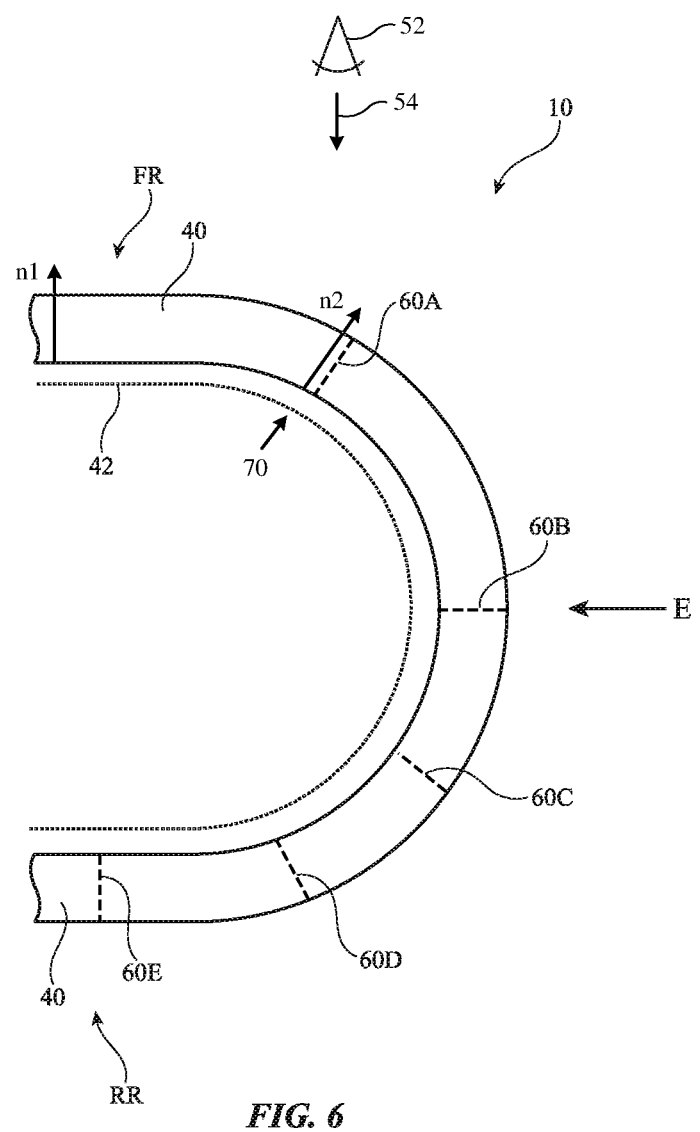
FIG. 6 is a cross-sectional side view of an illustrative sidewall portion of a display in accordance with an embodiment.

Device 10 may have upper and/or lower surfaces (e.g., external surfaces 56 on front face FR and rear face RR, respectively) that are planar and/or curved. The edges of device 10 may have sidewalls with planar and/or curved portions (e.g., surfaces with straight and/or curved profiles). As shown in FIG. 6, for example, the sidewalls of device 10 along one or more edges such as edge E of device 10 (e.g., left edge L, right edge R, upper edge T, lower edge B, and/or the corners of device 10) may have a curved outer surface.

Edge E may be transparent (e.g., the entire sidewall of device 10 may be transparent and may be formed from extended portions of upper and lower display cover layer(s)) and/or one or more portions of the curved sidewall of edge E may be opaque (e.g., formed from glass or other material that is coated with opaque material, formed from opaque polymer, formed from metal, and/or formed from other opaque structures). Opaque structures (e.g., metal housing wall portions) may extend along one or more portions of edge E (e.g., metal or other opaque material may form the portion of edge E between locations 60A and 60B, between locations 60B and 60C, between locations 60C and 60D, between locations 60D and 60E, between locations 60A and 60C, between locations 60B and 60D, between locations 60C and 60E, or between other suitable locations on edge E. There may be a single strip of metal housing material that runs around all four peripheral edges E of device 10, there may be a pair of discrete strips of metal housing material that run around all four peripheral edges E in parallel, there may be no non-glass structures on edges E, and/or there may be other suitable structures on edges E.

Display layer 42 may be formed from a single panel (e.g., a single flexible organic light-emitting diode display panel having a polyimide substrate or other flexible substrate with bent edge portions), may be formed from multiple panels (e.g., multiple panels separated from one or more gaps), may be formed from panels with slots and other openings, and/or may be formed from other types of displays. Portions of display layer 42 (e.g., all of layer 42 and/or the pixels and/or other structures of layer 42) may be omitted wherever layer 42 is overlapped by a metal portion of edge E and/or other opaque structures in edge E. For example, edge E may be formed from glass everywhere except between locations 60B and 60D. The portion of edge (sidewall) E between locations 60B and 60D may be formed from metal (as an example). In this type of scenario, no display layer 42 (or at least no pixels 44) may be overlapped by the metal and pixels 44 and display layer 42 may be present under the glass portions of edge E and/or display cover layer 40 on front face FR and/or rear face RR. If desired, device 10 may have external surfaces with compound curvature. For example, device 10 may have rounded corners and the surfaces of display 14 in the rounded corners may have compound curvature.

The angle at which viewer 52 views pixels 44 in display layer 42 in display 14 of device 10 varies depending on the curvature of the display surface on which the pixels are formed. If, as an example, a viewer such as viewer 52 of FIG. 6 is viewing device 10 in direction 54 and device 10 is oriented so that the surface normal of the planar central portion of display 14 (and display layer 42) is parallel to direction 54 (e.g., when viewer 52 is viewing display 14 head on), pixels 44 that are formed on the curved edge of display 14 may still be viewable to the viewer, but will be viewed at a non-zero angle of view. For example, pixels 44 in the planar central portion of display 14 may be characterized by a surface normal n1 that is parallel to direction 54, whereas pixels 44 near at a curved edge location such as location 70 of FIG. 6 may be characterized by a surface normal n2 that makes a non-zero angle with respect to direction 52. Pixels 44 may sometimes exhibit color shifts as a function of light emission angle. As a result, there may be a risk that pixels at off-axis (non-zero) viewing angles will exhibit undesired color shifts. This could cause the portion of an image on display 14 that is being displayed by pixels on the curved edges of display 14 to exhibit undesired color casts.

To help minimize undesired color shifts at off-axis viewing angles, the pixels of the curved edges of display 14 and, if desired, the other portions of display 14 may be provided with configurations that help reduce undesired color shifts due to off-axis viewing. For example, pixels 44 (e.g., organic light-emitting diode structures in pixels 44) may be formed that help mitigate color shift issues.

Figure 7:
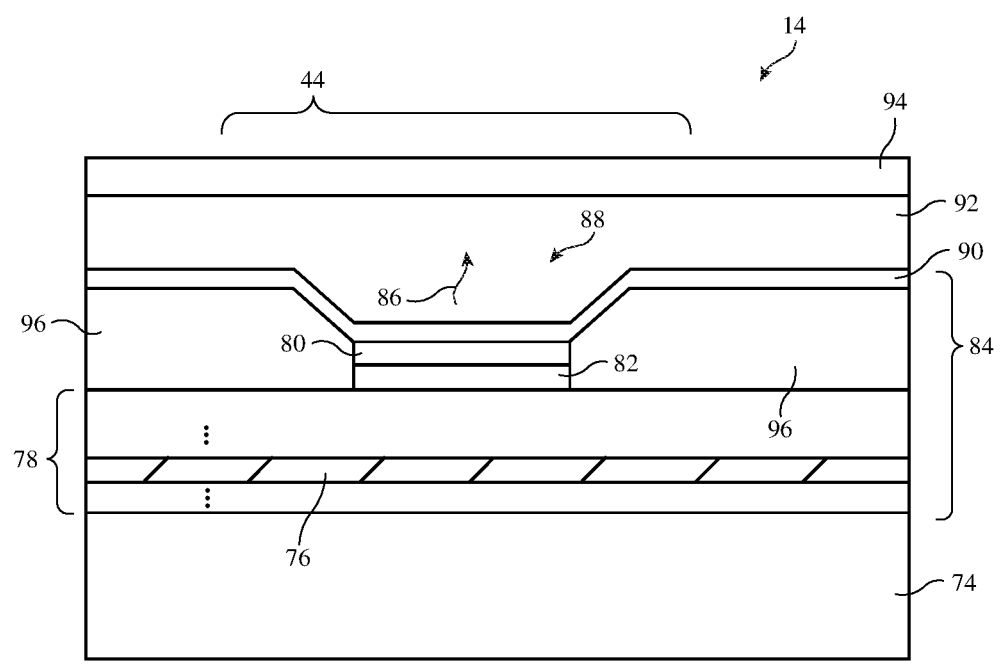
FIG. 7 is a cross-sectional side view of an illustrative pixel in a portion of a display in accordance with an embodiment.
Figure 8:
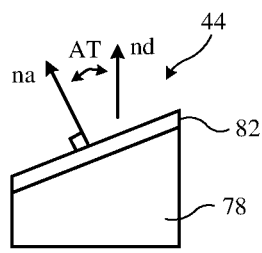
FIGS. 8, 9, 10, 11, 12, 13, 14, and 15 are diagrams showing illustrative pixels with tilted anodes in accordance with embodiments.
Figure 9:
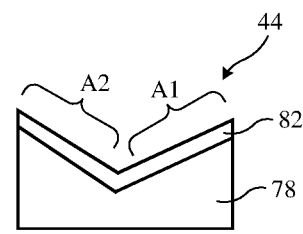

A cross-sectional side view of a portion of an illustrative organic light-emitting diode display is shown in FIG. 7. As shown in FIG. 7, display 14 may include a substrate layer such as substrate layer 74. Substrate 74 may be formed from plastic or other suitable materials. One or more sublayers of material may form substrate 74. Configurations for display 14 in which substrate 74 has been formed from a flexible material such as polyimide, acrylic, or other flexible polymer are sometimes described herein as an example.

Thin-film transistor circuitry 84 may be formed on substrate 74. Thin film transistor circuitry 84 may include thin-film layers 78. Layers 78 may include inorganic layers such as inorganic buffer layers, gate insulator, passivation, interlayer dielectric, and other inorganic dielectric layers. Layers 78 may also include organic dielectric layers such as a polymer layers. Polymer layers may be used, for example, as planarization layers, as interlayer dielectric, and as neutral stress plane adjustment layers (as examples). Metal layers and semiconductor layers may also be included within layers 78. For example, semiconductors such as silicon, semiconducting-oxide semiconductors such as indium gallium zinc oxide, or other semiconductor materials may be used in forming semiconductor channel regions for thin-film transistors. These transistors may form pixel control circuitry for pixels such as pixel 44. Metal in layers 78 may be used in forming transistor gate terminals, transistor source-drain terminals, capacitor electrodes, and metal interconnects. If desired, conductive polymers, conductive nanostructures, and other conductive materials may be included in display 14 (e.g., to form signal traces in a curved edge portion of display 14 in which substrate 74 and the layers on substrate 74 are bent out of the plane of the planar central portion off display 14).

As shown in FIG. 7, thin-film transistor circuitry 84 may include diode anode structures such as anode 82. Anode 82 may be formed from a layer of conductive material such as metal on the surface of layers 78 (e.g., on the surface of a planarization layer that covers underlying thin-film transistor structures). Light-emitting diode 88 may be formed within an opening in pixel definition layer 96. Pixel definition layer 96 may be formed from a patterned photoimageable polymer such as polyimide. In each light-emitting diode such as organic light-emitting diode 88 of pixel 44, a layer of organic emissive material 80 is interposed between a respective anode 82 and cathode 90. Anodes 82 may be patterned from a layer of metal. Cathode 90 may be formed from a common conductive layer that is deposited on top of pixel definition layer 40 (e.g., a thin layer of metal such as a layer of AgMg). Cathode 90 is at least partially transparent so that light 86 may exit light emitting diode 88 during operation of pixel 44. In some arrangements, the anode and cathode form a resonant structure (e.g., a Fabry-Perot cavity). The cavities can be configured to exhibit desired properties by adjusting cathode reflectivity and/or other diode structures.

Metal interconnect structures may be used to interconnect transistors and other components in display 14. Metal interconnect lines may also be used to route signals to capacitors, to data lines D and gate lines G, to contact pads (e.g., contact pads coupled to gate driver circuitry), and to other circuitry in display 14. As shown in FIG. 7, layers 78 may include one or more layers of patterned metal for forming interconnects such as metal traces 76. Portions of metal traces 76 and other conductive traces may extend from pixels 44 to inactive areas of display 14. Metal traces 76 may form data lines, power supply lines, gate lines (e.g., emission control lines, scan lines, etc.) and/or other signal lines in display 14. There may be multiple layers of metal traces such as metal traces 76.

If desired, display 14 may have outer display layers such as encapsulation layers, touch sensor layers, polarizer layers, adhesive layers, display cover layers, and/or other outer layers (see, e.g., illustrative outer layer 94 of FIG. 7).

To help mitigate color shift issues due to off-axis viewing along the edges of display 14 where the surface normal of display layer 42 is not parallel to the surface normal of the planar central portion of layer 42, pixels 44 may be provided with tilted anodes. For example, in a portion of display 14 that is characterized by a display surface normal, an anode 82 in a pixel 44 may have a an anode surface normal that is not parallel to the display surface normal. Use of pixels 44 with this type of tilted anode structure, which may sometimes be referred to as a tilted anode, non-planar anode, etc., creates varying angles of view between the emitting surfaces of the organic light-emitting diodes in display 14 and viewer 52. Overall color shifting effects are reduced by creating more than one type of angle-of-view color shift within a pixel so that color shifting effects from one portion of an anode are compensated by color shifting effects in another portion of the anode and/or by creating compensating angle-of-view color shifts within the pixels in a set of pixels.

As an example, consider an arrangement in which a first pixel pair is located on a curved portion of display 14 and a second pixel pair is located on a planar central portion of display 14. Each pixel pair may have a first pixel with an anode that is tilted at a 5° angle and a second pixel that is tilted at a −5° angle. When the first pixel pair is located on a portion of a curved edge surface that causes that first pixel pair to be viewed at a 5° angle (e.g., relative to surface normal n1), the second pixel of the first pixel pair may be oriented parallel to direction 54 and the first pixel of the pixel pair may be oriented at a 10° angle relative to direction 54. In the second pixel pair in the central portion of display 14, in contrast, the first pixel will be oriented at 5° relative to the viewer's viewing direction and the second pixel will be oriented at −5° relative to the viewer's viewing direction. In this type of display arrangement, the color shift exhibited between the first pixel pair and the second pixel pair may be reduced relative to a configurations in which the first and second pixel pairs have anodes that are not tilted, thereby reducing undesired color shifting effects in the curved edge portions of display 14.

Cross-sectional side views of pixel structures with tilted anodes are shown in FIGS. 8, 9, 10, 11, and 12. As show in the example of FIG. 8, display layer 42 (and display 14) for pixel 44 may be characterized by a display surface normal nd (e.g., a display surface normal that corresponds to the surface normal of the display cover layer in that portion of display 14 and that corresponds to the surface normal of other display layers in that portion of display 14 such as substrate 74). Anode 82 may be tilted at a non-zero angle AT, so that the surface normal na of anode 82 is not parallel to display surface normal nd. The tilt in the surface of anode 82 may be created by forming non-planar structures under anode 82, by locally varying the thickness of anode 82, and/or using other suitable anode tilting structures.

Figure 10:
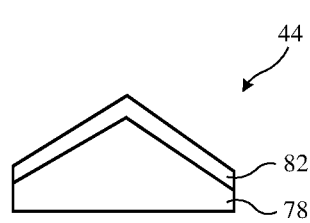
Figure 11:
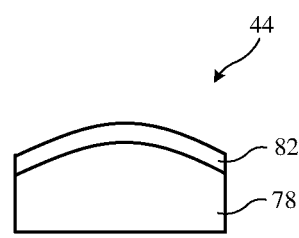
Figure 12:
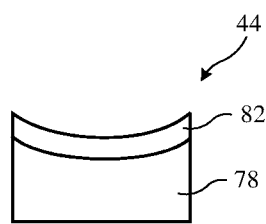

A single pixel 44 may have an anode 82 with different portions that are angled differently. As shown in the illustrative pixel 44 of FIG. 9, for example, anode 82 may have a first portion such as the portion in area A1 that is tilted to the left and a second portion such as the portion in area A2 that is tilted to the right. In the FIG. 9 example, areas A1 and A2 are tilted towards each other. If desired, a pixel 44 may have an anode 82 with tilted portions that are tilted away from each other, as shown in FIG. 10. FIGS. 11 and 12 show how pixel 44 may have anodes 82 with curved surface profiles. Anode 82 may, for example, have a convex surface with a raised central portion as shown in FIG. 11 and/or a concave surface with a recessed central portion as shown in FIG. 12.

Figure 13:
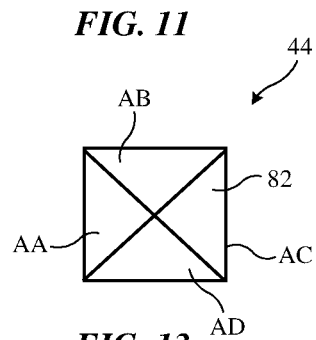
Figure 14:
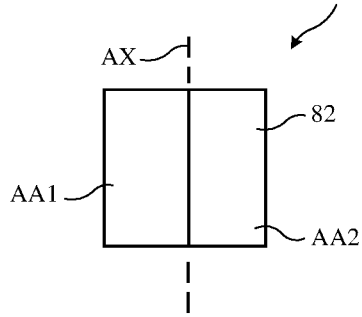
Figure 15:
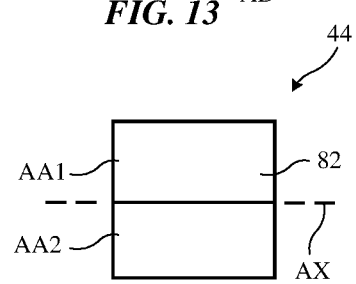

There may be one or more non-planar areas in each pixel 44. As shown in the top view of FIG. 13, for example, there may be four areas AA, AB, AC, and AD in anode 82. Each of these areas may be tilted in a different direction (e.g., right, down, left, and up, respectively, in an illustrative arrangement). The shape of anode 82 may be pyramidal to form a pyramidal protrusion (pyramid) or a pyramidal recess. As shown in the example of FIG. 14, anode 82 may have first and second areas AA1 and AA2, respectively. These areas may be tilted in opposite directions. For example, the portion of anode 82 in area AA1 may be tilted to the right by AG degrees and the portion of anode 82 in area AA2 may be tilted to the left by AG degrees. Portions AA1 and AA2 may be tilted towards each other or away from each other about axis AX. Axis AX is oriented vertically (parallel to the Y axis of FIG. 2 and lying in the plane of the surface of display 14) in the example of FIG. 14. If desired, axis AX may be oriented horizontally (see, e.g., FIG. 15) or at other angles (e.g., diagonally, etc.).

Figure 16:
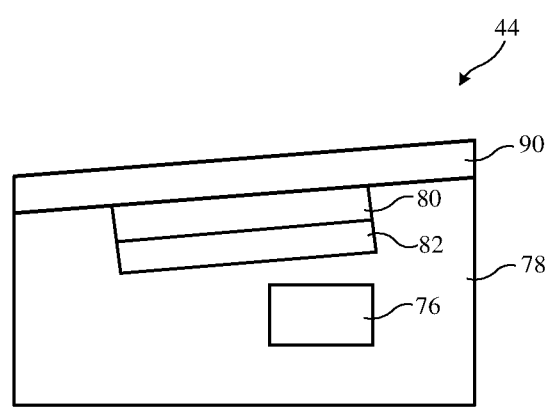
FIG. 16 is a cross-sectional side view of an illustrative pixel with an anode that has been tilted due to the presence of an underlying metal line in accordance with an embodiment.

FIG. 16 is a cross-sectional side view of a portion of an illustrative pixel 44 in which anode 82 has been tilted to the left due to the presence of a signal line or other structure formed from metal trace 74 under the right side of anode 82. The metal trace causes the right portion of anode 82 to protrude (elevate) from display layer 42 more than the left portion of anode 82 that does not overlap the metal trace. Metal trace 74 may form a data line, gate line, power supply line, or other signal line in display 14 or may be an isolated metal trace that is not coupled to active signal lines (e.g., metal trace 74 may be a dummy line). Non-metal structures may also be formed under portions of anode 82 to tilt anode 82 at a non-zero angle if desired. If desired, anodes such as anode 82 of FIG. 16 may be tilted by using half-tone mask lithography to form tilted surfaces in underlying polymer structures or other underlying thin films in layers 78 of display layer 42.

Figure 17:
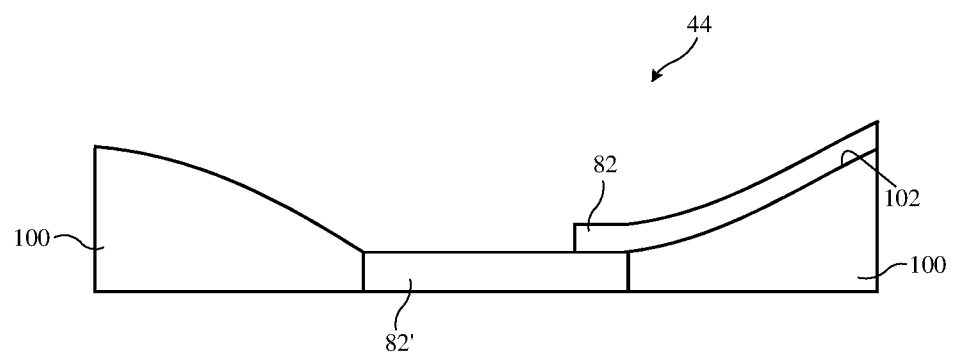
FIGS. 17 and 18 are cross-sectional side views of illustrative pixels with tilted anodes in accordance with embodiments.
Figure 18:
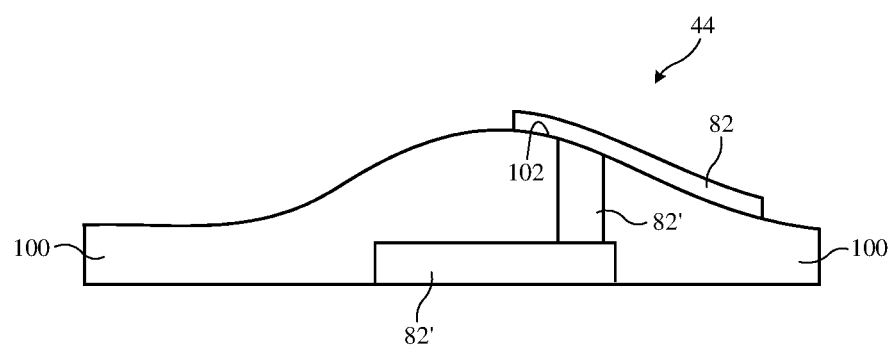

Another illustrative configuration for tilting anode 82 is shown in FIGS. 17 and 18. In the illustrative arrangements of FIGS. 17 and 18, photoimageable polymer layer 100 has been patterned to form tilted surface 102 (e.g., during a photolithography process using a halftone mask or during another suitable fabrication process). Anode 82 may have a concave shape (FIG. 17), a convex shape (FIG. 18), and/or other suitable shape that provides portions of the surface of the anode with a tilted orientation.

Figure 19:
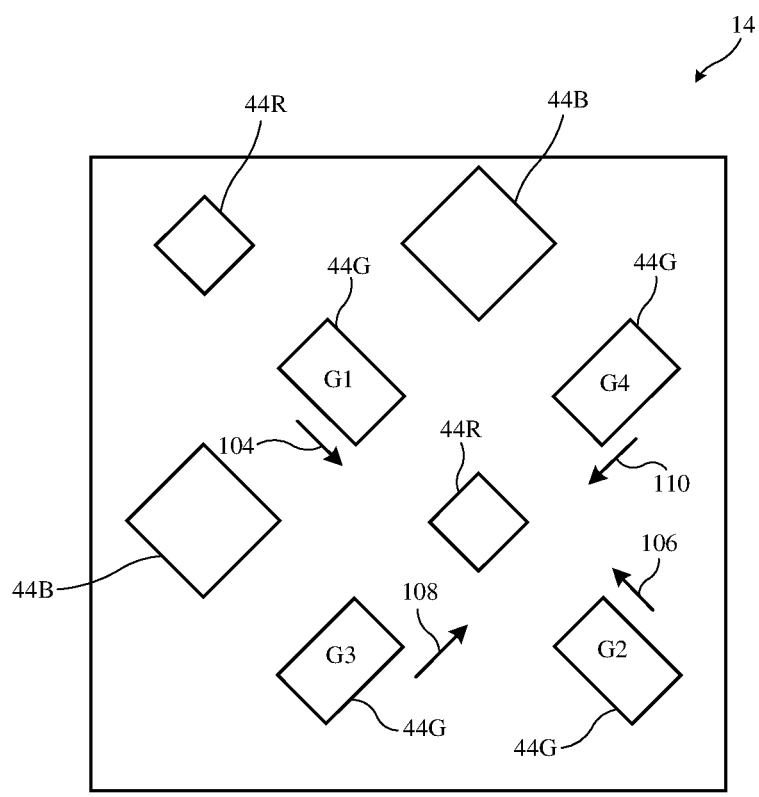
FIG. 19 is a top view of an illustrative pixel layout for a display with tilted anodes in accordance with an embodiment.

If desired, sets of two or more pixels 44 with tilted anodes 82 may be configured so that anode tilts compensate each other. Consider, as an example, display 14 of FIG. 19. In the example of FIG. 19, pixels 44R may be red pixels, pixels 44B may be blue pixels, and pixels 44G may be green pixels (as an example). Each set of four pixels (or other suitable number of pixels) may be shorted together with shared diode drive paths and driven with one or more transistors that are controlled by a shared data value and/or the pixels in each set of pixels may be each be loaded with the same pixel data value during loading of the pixels of display 14 with display driver circuitry in display 14. Each of the four pixels may have a different anode tilt. For example, green pixels 44G may include a first green pixel G1 that is tilted in direction 104, a second green pixel G2 that is tilted in opposite direction 106 to compensate for the tilt of pixel G1, a third green pixel G3 that is tilted in direction 108, and a fourth green pixel G4 that is tilted in opposite direction 110 to compensate for the tilt of green pixel G3. In this type of configuration, the set of four green pixels 44G can be operated as a single pixel that has a variety of anode tilts and which may therefore exhibit less viewing angle dependence. All pixels in display 14 may be operated in this way or only the pixels 14 on the curved edges of display 14 may be operated in this way (e.g., to preserve resolution in the center of display 14). Other sets of pixels having more than four or fewer than four pixels may be used, if desired. For example, display 14 may have pixel pairs that each contain first and second pixels 44 that are operated together to reduce viewing angle dependence of display output color.

If desired, the properties of pixels 44 may be varied as a function of position within display 14. For example, pixels 44 in a curved edge portion of the display may be configured differently than pixels in a planar central portion of the display and may have one or more properties that increase in value at increasing distance toward the periphery of display 14.

Figure 20:
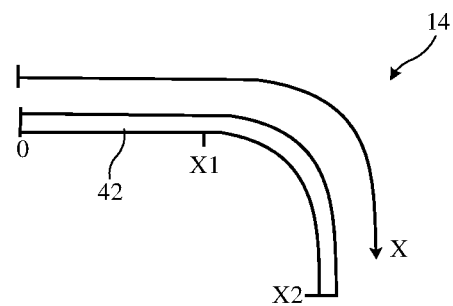
FIG. 20 is a cross-sectional side view of an illustrative display with a curved edge in accordance with an embodiment.

Pixels 44 may, for example, have properties that vary as a function of lateral dimensions such as dimension X of FIG. 20. As shown in illustrative display 14 of FIG. 20, display layer 42 may have a planar central portion (see, e.g., the portion of display 14 between position X=0 and position X=X1 in FIG. 20) and a curved edge portion (see, e.g., the portion of display 14 between position X1 and X2 in FIG. 20). The properties of pixels 44 may (as an example) all be the same within the planar central portion, whereas in the curved edge portion the properties of pixels 44 may differ from each other and/or from the pixels in the central portion. The curved edge portion pixels may all be the same as each other (while differing from the central portion pixels) and/or the curved edge portion pixels may have properties that vary as a function of distance X between positions X1 and X2 to help reduce color shift effects in the curved edge of display 14.

Figure 21:
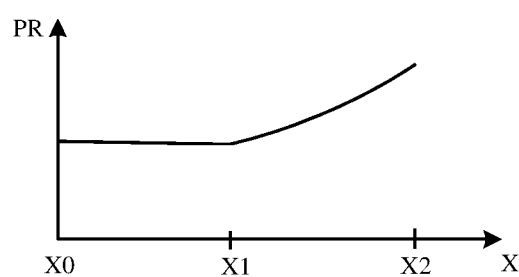
FIG. 21 is a graph showing how one or more pixel characteristics may be varied as a function of distance onto a curved edge to provide a display with angle-of-view color shift compensation in accordance with an embodiment.

FIG. 21 is a graph showing how one or more pixel properties PR may vary across display 14. Pixel property PR may, as an example, be fixed within the central planar portion of display layer 42 and may vary as a function of distance X away from the central portion between X1 (the boundary between the planar portion of the display and the curved portion of the display) and X2 (the outermost peripheral edge of device 10). The pixels 44 in the curved edge portion may, for example, tilt by increasing amounts at distances X past X1 towards X2 or may exhibit other pixel property PR that increases in this way as indicated by the graph of FIG. 21. This may help create a uniform appearance (e.g., uniform color and/or intensity) for the portions of the images on display 14 that are displayed within the curved edge portion (X between X1 and X2) of display 14. Pixel property PR may include one or more properties such as pixel size, anode tilt, anode shape, emissive material composition, organic light-emitting diode construction (e.g., diode cavity strength in arrangements in which each organic light-emitting diode 88 has a Fabry-Perot cavity with a strength that can be configured to selective adjustment of anode and/or cathode reflectivities and/or other cavity properties), any other pixel property, and/or any combination of two or more of these pixel properties.

Figure 22:
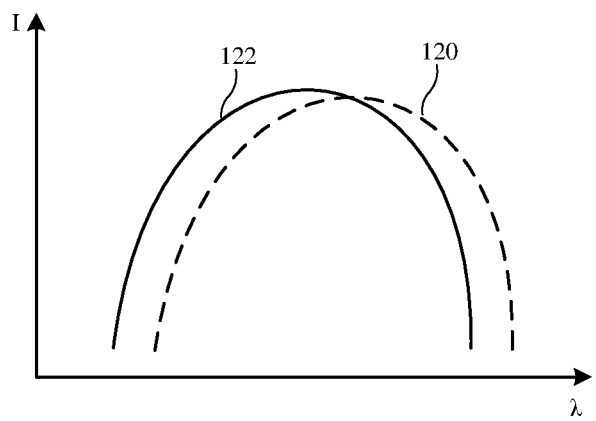
FIGS. 22 and 23 are graphs showing how pixels at different locations such as different locations within a curved display edge may have different angle-of-view color shift characteristics in accordance with an embodiment.
Figure 23:
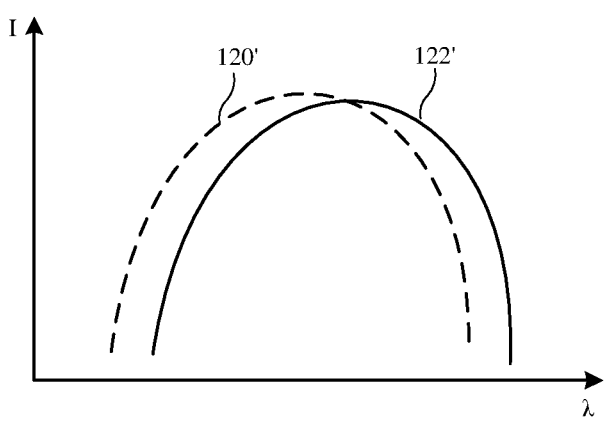

FIGS. 22 and 23 are graphs showing how the amount of emitted light (intensity I) of a pixel may shift in wavelength λ as a function of viewing angle. In the arrangement of FIG. 22, an off-axis viewing angle (e.g., +20°) has given rise to a red shift (color shift towards longer wavelengths) for the light 86 being emitted by the organic light-emitting diode 88 of a given pixel (see, e.g., the red shift from on-axis output light spectrum 122 to red-shifted off-axis output light spectrum 120). Another pixel (e.g., a paired pixel in a set of two adjacent pixels of the same color that has been loaded with a common data value so that that pixel emits the same amount of light as the given pixel) may have different properties PR (e.g., a different composition for emissive layer 80, a different cavity construction, etc.), so that this other pixel may exhibit an opposing color shift as a function of increasing angle of light emission (see, e.g., the blue shift behavior of the graph of FIG. 23 in which on-axis spectrum 122' shifts towards shorter wavelengths to produce off-axis spectrum 120' when viewed off axis). Because the two pixels in the set of paired pixels of this example exhibit different and compensating color shifts with angle of view, the resulting color shift of the pair of pixels taken together will be balanced and will exhibit less color shift than a single pixel of a given construction. The pixels of the pair of pixels can be coupled together physically (e.g., the diodes of the pixels may be shorted together electrically) or may be coupled together virtually (e.g., the pixels of the pair may emit the same intensity of light by virtue of being loaded with an equal data value during operation of the display).

The foregoing is merely illustrative and various modifications can be made to the described embodiments. The foregoing embodiments may be implemented individually or in any combination.

What is claimed is:

1. An electronic device, comprising:
   a housing; and
   a display coupled to the housing, wherein the display has a central portion that is planar and an edge portion with a curved surface profile, wherein the display has pixels in the curved surface profile that include organic light-emitting diodes with tilted anodes, wherein the pixels with tilted anodes are organized in sets, wherein the display has a surface normal at each set, wherein each set includes first and second pixels that emit light in respective first and second light emission directions, and wherein the first and second light emission directions are respectively tilted away from the surface normal for that set in first and second different directions when viewed from above along the surface normal for that set.

2. The electronic device defined in claim 1 wherein the anode of the organic light-emitting diode in each of the pixels in each set is tilted differently.

3. The electronic device defined in claim 1 wherein each set, has third and fourth pixels that emit light in respective third and fourth light emission directions, and wherein the third and fourth light emission directions are respectively tilted away from the surface normal for that set in third and fourth different directions when viewed from above along the surface normal for that set.

4. The electronic device defined in claim 1 wherein each of the tilted anodes is located in a portion of the display characterized by a respective display surface normal and has a respective anode surface normal that is oriented at a non-zero angle relative to that display surface normal.

5. The electronic device defined in claim 1 wherein the tilted anode of each pixel has a first area that is tilted in a first direction and a second area that is tilted in a second direction that is different than the first direction.

6. The electronic device defined in claim 1 wherein the tilted anode of each pixel has a pyramidal structure.

7. The electronic device defined in claim 1 wherein the first and second respective anodes that are tilted in opposite directions.

8. The electronic device defined in claim 1 wherein each tilted anode has a first area that overlaps a metal trace that causes the first area to protrude with respect to a second area that does not overlap the metal trace.

9. The electronic device defined in claim 1 wherein each tilted anode is formed on a tilted surface of a photoimageable polymer layer.

10. An electronic device, comprising:
    a housing; and
    a display layer coupled to the housing, wherein the display layer has a rectangular central region and a bent edge portion with a curved surface profile that runs along an edge of the rectangular central region, wherein the bent edge portion includes pixels each of which has an organic light-emitting diode with an anode having an anode surface normal and wherein each of the anodes is located in a respective portion of the display having a display surface normal that is oriented at a non-zero angle with respect to the anode surface normal of that anode, wherein a first of the organic light-emitting diodes has a first anode having a first tilt, wherein a second of the organic light-emitting diodes has a second anode having a second tilt that is different than the first tilt, wherein the first organic light-emitting diode is configured to emit light in a first direction, and wherein the second organic light-emitting diode is configured to emit light in a second direction that is different than the first direction, and wherein the first of the organic light-emitting diodes and the second of the organic light-emitting diodes are configured to be operated as a single pixel.

11. The electronic device defined in claim 10 further comprising a display cover layer with a first portion that overlaps the rectangular central region and a second portion with a curved surface profile that overlaps the bent edge portion.

12. The electronic device defined in claim 11 wherein each anode has a first portion with a first tilt and a second portion with a second tilt that is different than the first tilt.

13. The electronic device defined in claim 11 wherein the first organic light-emitting diode is configured to emit a first amount of light, wherein the second organic light-emitting diode is configured to emit a second amount of light and wherein the first and second amounts of light are equal.

14. The electronic device defined in claim 10 wherein the anodes have curved surface profiles.

15. The electronic device defined in claim 10 wherein the anodes have pyramidal shapes.

16. The electronic device defined in claim 10 further comprising cellular telephone transceiver circuitry.

17. An electronic device, comprising:
    a housing; and
    a display coupled to the housing, wherein the display includes a flexible organic light-emitting diode display layer with pixels, wherein the flexible organic light-emitting diode display layer has a planar central portion and has a bent edge portion with a curved surface profile, wherein the pixels have an associated pixel characteristic, wherein the pixel characteristic is varied by an increasing amount with increasing distance from the planar central portion into the bent edge portion, and wherein the pixel characteristic comprises pixel emissive material composition.

18. The electronic device defined in claim 17 wherein the pixels have an additional associated pixel characteristic, wherein the additional pixel characteristic is varied by an increasing amount with increasing distance from the planar central portion into the bent edge portion, wherein the pixels in the bent edge portion have tilted anodes, and wherein the pixel characteristic comprises anode tilt.

19. The electronic device defined in claim 17 wherein the pixels have an additional associated pixel characteristic, wherein the additional pixel characteristic is varied by an increasing amount with increasing distance from the planar central portion into the bent edge portion, and wherein the additional pixel characteristic comprises diode cavity strength.

\* \* \* \* \*